United States Patent [19]

Sakaue et al.

[11] 4,316,100
[45] Feb. 16, 1982

[54] CHARGE TRANSFER DEVICE WITH OUTPUT DETECTED WITHIN DYNAMIC RANGE

[75] Inventors: Tatsuo Sakaue; Tetsuya Iida, both of Yokohama, Japan

[73] Assignee: Tokyo Shibaura Denki Kabushiki Kaisha, Japan

[21] Appl. No.: 143,130

[22] Filed: Apr. 23, 1980

[30] Foreign Application Priority Data

Apr. 27, 1979 [JP] Japan .................................. 54-52330
Apr. 27, 1979 [JP] Japan .................................. 54-52338

[51] Int. Cl.³ .................... G11C 19/28; H01L 29/78; H03H 15/02; H04N 5/21
[52] U.S. Cl. .................. 307/221 D; 357/24; 333/165; 358/905
[58] Field of Search ..................... 357/24; 307/221 D; 333/165; 358/905

[56] References Cited

U.S. PATENT DOCUMENTS 4,080,581  3/1978  Sakaue et al. ................... 307/221 D
4,127,874  11/1978  Iwasawa et al. ..................... 358/905
4,139,784  2/1979  Sauer ................................ 357/24
4,249,145  2/1981  Sakaue et al. ....................... 333/165

OTHER PUBLICATIONS

Proceedings of the 5th International Conference on Charge-Coupled Devices, pp. 222 to 229 "Digitally-controlled and electrically-Programmable CCD transversal filter LSI" T. Sakaue et al.

Primary Examiner—Gene M. Munson
Attorney, Agent, or Firm—Finnegan, Henderson, Farabow, Garrett & Dunner

[57] ABSTRACT

Disclosed is a charge transfer device, like a transversal filter, having means for detecting if an amount of signal charge transferred from one stage to another falls within a dynamic range of the device. A charge transfer channel is so formed as to have first and second branched output ports. A signal charge transferred to the first output port is detected as an output signal supplied to a utilization circuit while an output voltage caused by a signal charge transferred to the second output port is compared with first and second reference voltages which correspond to first and second amounts of signal charges substantially determining upper and lower limits of the dynamic range of the device, whereby it is detected if the amount of the signal charge transferred is within the dynamic range or not. As a result of the detection when the signal charge amount is outside the dynamic range, the supply of the output signal to the utilization circuit is interrupted.

3 Claims, 6 Drawing Figures

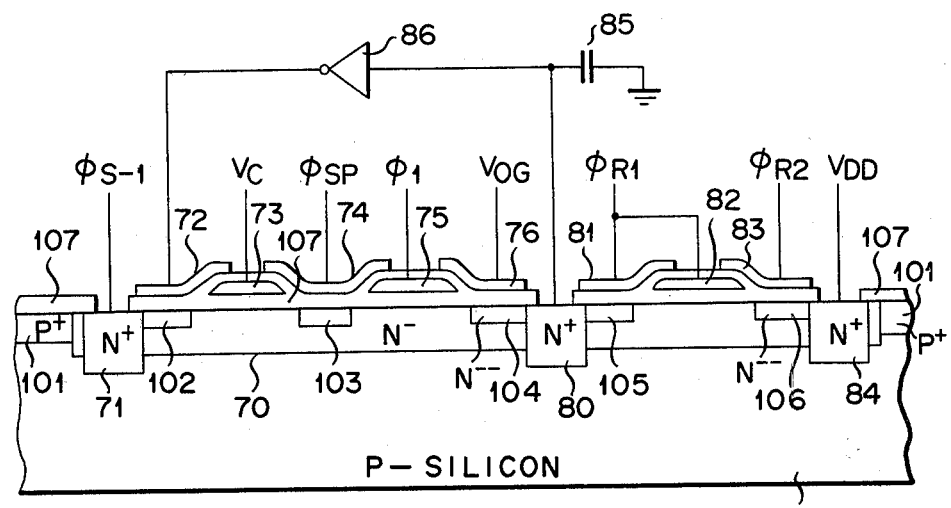
FIG. 4
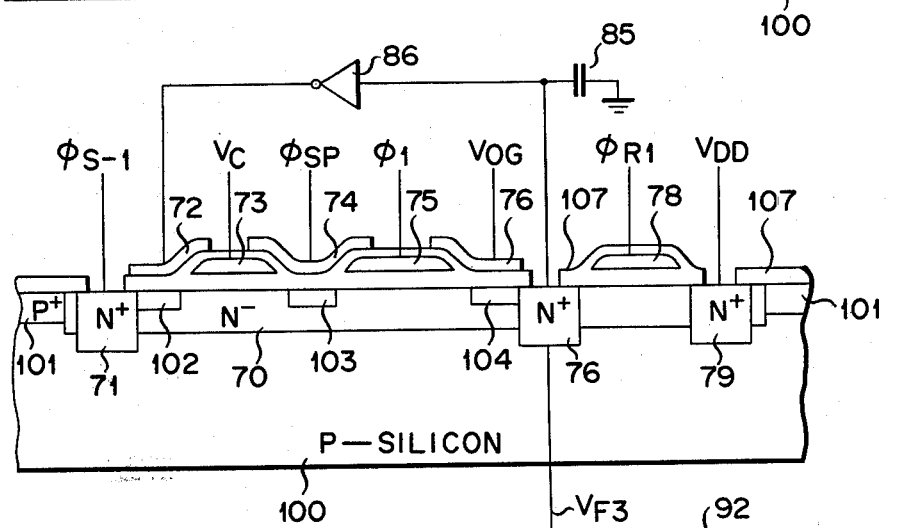
FIG. 5
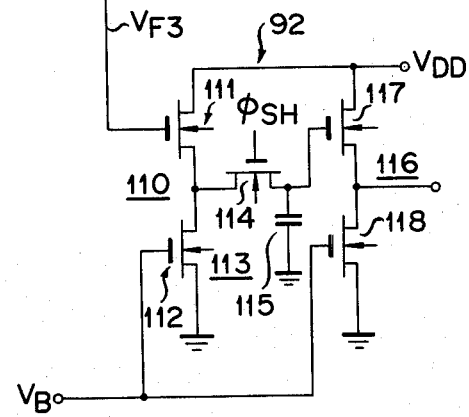

F I G. 6
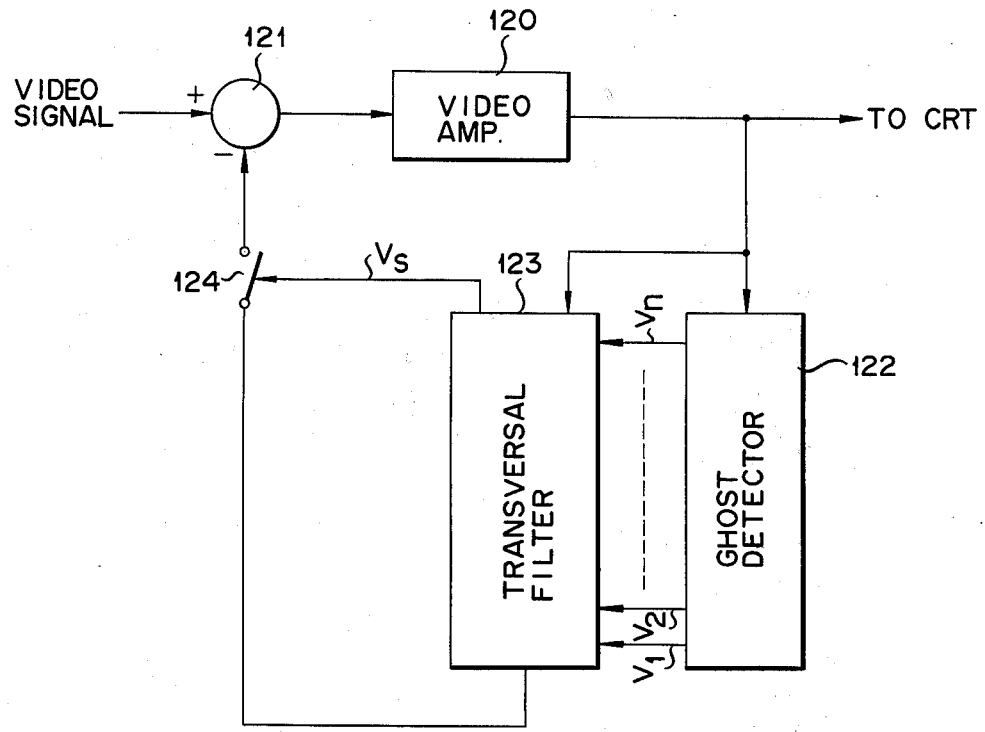

CHARGE TRANSFER DEVICE WITH OUTPUT DETECTED WITHIN DYNAMIC RANGE

The present invention relates to charge transfer device and, more particularly, to a charge transfer device for processing an analog signal which has a means for detecting whether an amount of signal charge transferred from one stage to another falls within a proper range or not.

A transversal filter for analog signal processing with a compact structure may be realized by using delay, addition, subtraction and multiplication functions of a charge-coupled device (CCD). Such a filter is disclosed in U.S. Pat. No. 4,080,581 issued to Tatsuo Sakaue et al., Mar. 21, 1978. In the input-weighted transversal filter disclosed in this patent, an analog input signal is multiplied by weighting signals, weighted signal charge packets are injected into the respective stages of a CCD transfer channel or register, and each weighted signal charge packet is progressively transferred to the final stage while being added to a delayed signal charge packet from the preceding stage. Because of addition of the charge packets, the amount of the signal charge transferred gradually increases as the signal charge travels from the first stage to the final stage. For securing an accurate analog signal processing, even if the amount of signal charge increases due to the addition of signal charge packets, the amount of signal charge to be transferred from one stage to another must be within a linear region of a dynamic range of the CCD register. In other words, even if the amount of signal charge is increased due to the addition, the amount of charge must not exceed the maximal amount of the signal charge which can be stored in each stage. The maximal amount of signal charge storable in each stage depends on an area of a potential well and a capacity thereof.

A copending U.S. patent application Ser. No. 63,564, filed on Aug. 3, 1979 and entitled "INPUT-WEIGHTED CHARGE TRANSVERSAL FILTER," assigned to the same assignee as this invention discloses a transversal filter which is capable of positive or negative weighting of an analog signal in order to obtain a desired frequency response. The positive weighting of the signal is performed by injecting a weighted signal charge packet to a stage of CCD register. On the other hand, the negative weighting of the signal is performed by rejecting a weighted signal charge packet from a stage. In other words, the negative weighting is performed by subtraction of the signal charge, with the result that the amount of signal charge transferred from one stage to another in the CCD register decreases. For ensuring an accurate analog signal processing, even if the amount of signal charge is decreased due to the subtraction, the amount of signal charge transferred from one stage to another must be within the dynamic range of CCD register. In other words, the minimal amount of charge in each stage must be larger than the minimal amount of signal charge transferable. A usual CCD register operates within the dynamic range and the amount of signal charge injected into the register and transferred from one stage to another is proportional to the amplitude of an analog signal sampled.

The transversal filter, finding a variety of applications of the analog signal processing, may be used in a ghost killer for removing a ghost signal from a receiving television signal as disclosed in U.S. Pat. No. 4,127,874 issued to Mineo Iwasawa et al. The ghost killer is comprised of a ghost detector which detects a ghost signal contained in the video signal to form a plurality of weighting signals, a transversal filter which receives the video signal and the weighting signals to form a pseudo-ghost signal, and a subtractor which subtractively combines the video signal and the pseudo-ghost signal thereby to remove the ghost signal from the video signal. When the transversal filter is used in such a ghost killer, there may occur a case where the amount of signal charge transferred through the respective stages in the CCD register falls outside the linear region due to the addition or subtraction function of transversal filter when the level of ghost signal or noises in the video signal is considerably large. In such a case, a proper operation of the ghost killer is lost so that the quality of a picture reproduced by the picture tube is more deteriorated, compared to that reproduced when no ghost killer is used.

Consequently, it is desired that the charge transfer device like the transversal filter be so designed as to detect if the amount of signal charge transferred through the CCD register is within the dynamic range or not and, when it is outside the dynamic range, the processing of the analog signal using the charge transfer device be interrupted.

Accordingly, an object of the invention is to provide a charge transfer device, like a transversal filter, having means for detecting if an amount of signal charge transferred from one stage to another of a charge transfer channel falls within a given range or not.

According to the invention, a charge transfer channel is so formed as to have first and second branched output ports. A signal charge transferred to the first output port is detected as an output signal of the device by a first output detecting means and is applied to a utilization circuit. A signal charge transferred to the second output port is detected by a second output detecting means. First and second reference voltage generating circuits are provided to produce first and second voltages corresponding to the upper and lower limits of a given range of the amount of signal charge transferred from one stage to another in the charge transfer channel. An output voltage of the second output detecting means corresponding to the amount of the signal charge transferred from one stage to another in the charge transfer channel is compared with the first and second reference voltages, thereby to detect if the amount of the signal charge transferred from one stage to another falls within a given range. When the signal charge amount is not within the given range, the supply of the output signal from the first output detecting means to utilization circuit is interrupted.

The first reference voltage is selected to have a value corresponding to an amount of charge which is slightly less than an amount of charge to fully fill each of potential wells of the charge transfer channel. The second reference voltage is selected to have a value corresponding to an amount of charge enough to allow it to be transferred.

Other objects and features of the invention will be apparent from the following description taken in connection with the accompanying drawings, in which:

FIGS. 4 and 5 are schematic cross sectional views taken along lines A-A' and B-B' of the reference signal generator shown in FIG. 3; and FIG. 6 is a block diagram of a ghost killer to which the charge transfer device of the invention is applied.

Figure 1:
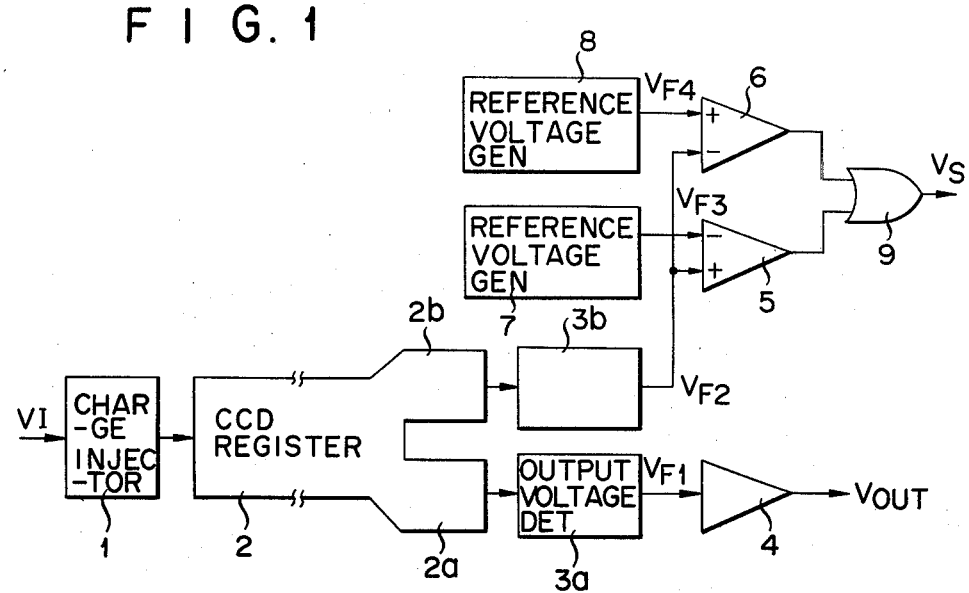
FIG. 1 is a schematic block diagram of a charge transfer device according to the invention.

The invention will be described in detail referring to the accompanying drawings. Referring to FIG. 1, there is shown a basic construction of a charge transfer device according to the invention in which a usual CCD register or a charge transfer channel is employed in place of a transversal filter for simplicity of explanation.

In the charge transfer device shown in FIG. 1, a charge injector 1 samples an analog input signal $V_I$ biased by a DC voltage and injects a signal charge packet proportional to a sampled analog input signal into the first stage of a CCD register 2. The signal charge packets injected are successively transferred from the first stage of register 2 to the final stage in a known manner. The CCD register 2 is so designed as to have two branched output ports 2a and 2b. Accordingly, the signal charge packets transferred through the CCD register 2 are branched and detected as output signal voltages $V_{F1}$ and $V_{F2}$ by output voltage detectors 3a and 3b. The output voltage $V_{F1}$ from the output voltage detector 3a is amplified by an amplifier 4 and is used as an output signal. The output voltage $V_{F2}$ from the output voltage detector 3b is coupled with a non-inverting input of a voltage comparator 5 and an inverting input of a voltage comparator 6. A reference voltage $V_{F3}$ produced by a reference voltage generator 7 is coupled with an inverting input of the comparator 5 while a reference voltage $V_{F4}$ produced by a reference voltage generator 8 is coupled with a non-inverting input of the comparator 6. The outputs of the comparators 5 and 6 are coupled with an OR gate 9.

Figure 2:
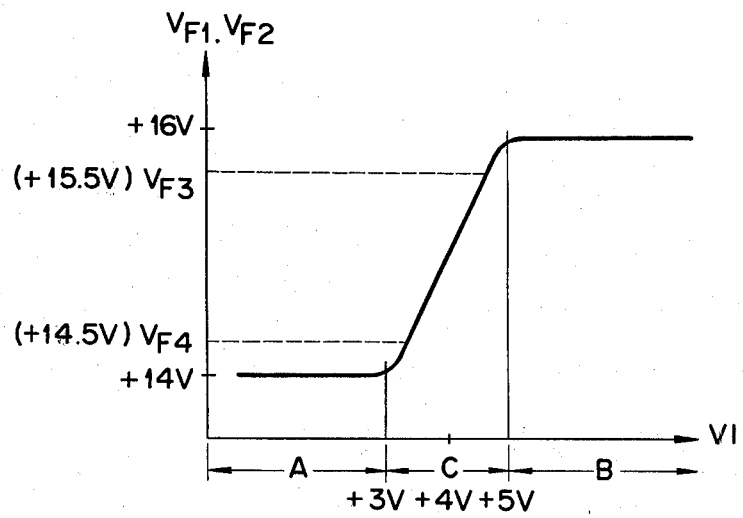
FIG. 2 is a graphical representation of a charge transfer characteristic of a CCD register used in FIG. 1.

FIG. 2 is a graphic representation of an example of a charge transfer characteristic of the CCD register 2 with a semiconductor substrate of P type, which is defined by an input signal voltage $V_I$ and an output voltage $V_{F1}$, $V_{F2}$ detected by the output port. As seen from the charge transfer characteristic, in a region denoted as A where a potential of the input signal $V_I$ which is the superposition of an analog signal and a DC voltage (+4 V), the output voltage detected by the output voltage detector remains fixed at +14 V irrespective of a change of the input voltage $V_I$. In a region B where the input signal $V_I$ is +5 V or more, the output voltage detected by the output detector keeps a fixed voltage of +16 V. Within a dynamic range where the input signal $V_I$ ranges from +3 V to +5 V, the output voltage ranges from +14 V to +16 V. In other words, in a region C, an output voltage detected is proportional to an instantaneous potential of the input signal. The charge transfer characteristic will be described in terms of the amount of signal charge injected into the CCD register 2 and transferred therethrough. In the region A where the input signal potential is below +3 V, an amount of charge, which is enough to saturate the respective potential wells in the CCD register 2, is injected into the CCD register 2. In the region B where the input signal potential is above +5 V, an amount of charge, which is insufficient to be transferred, is injected into the CCD register 2. In the region C where the input signal potential ranges +3 V to +5 V, an amount of signal charge, which is proportional to an input signal potential, is injected into the CCD register 2.

The reference voltage generators 7 and 8 are fabricated on the same semiconductor substrate as the CCD register 2. The reference voltage generator 7 is so designed as to produce a voltage, e.g. +15.5 V, slightly lower than the output voltage (+16 V) in the region B of the charge transfer characteristic, or a voltage corresponding to the minimal amount of signal charge which is allowed to be transferred from the first stage to the final stage of the CCD register. The reference voltage generator 8 is so designed to produce a voltage, e.g. +14.5 V, slightly higher than the output voltage (+14 V) in the region A, i.e. a voltage corresponding to an amount of charge slightly less than the saturating amount of charge for each potential well of the CCD register 2.

Accordingly, in the circuit arrangement shown in FIG. 1, when the output voltage $V_{F2}$ detected by the output voltage detector 3b is lower than the voltage $V_{F4}$ (+14.5 V), the comparator 6 produces an output signal of logic 1 level. When the output voltage $V_{F2}$ is higher than the voltage $V_{F3}$ (+15.5 V), the comparator 5 produces an output signal of logic 1 level. In both the cases, the output Vs of the OR gate 9 goes high. The output signal Vs of logic 1 level from the OR gate 9 may be used to interrupt the supply of the output signal Vout from the output voltage detector 3a to its utilization circuit in such a case where the amplitude of the input signal $V_I$ exceeds a proper range due to some causes. This may be realized by merely providing an electronic switch which is disabled by the output signal of logic 1 level from the OR gate 9, between the output detector 3a and the utilization circuit. The detection of the amount of signal charge transferred through the CCD register, or the detection as to if the CCD register operates within the dynamic range or not, is not generally needed in the charge transfer device of the type in which the signal charge is injected into only the first stage of CCD register. Such a detection, however, is particularly important in a transversal filter in which signal charge is injected to the stages of CCD register or signal charge is rejected from the stages of CCD register.

Figure 3:
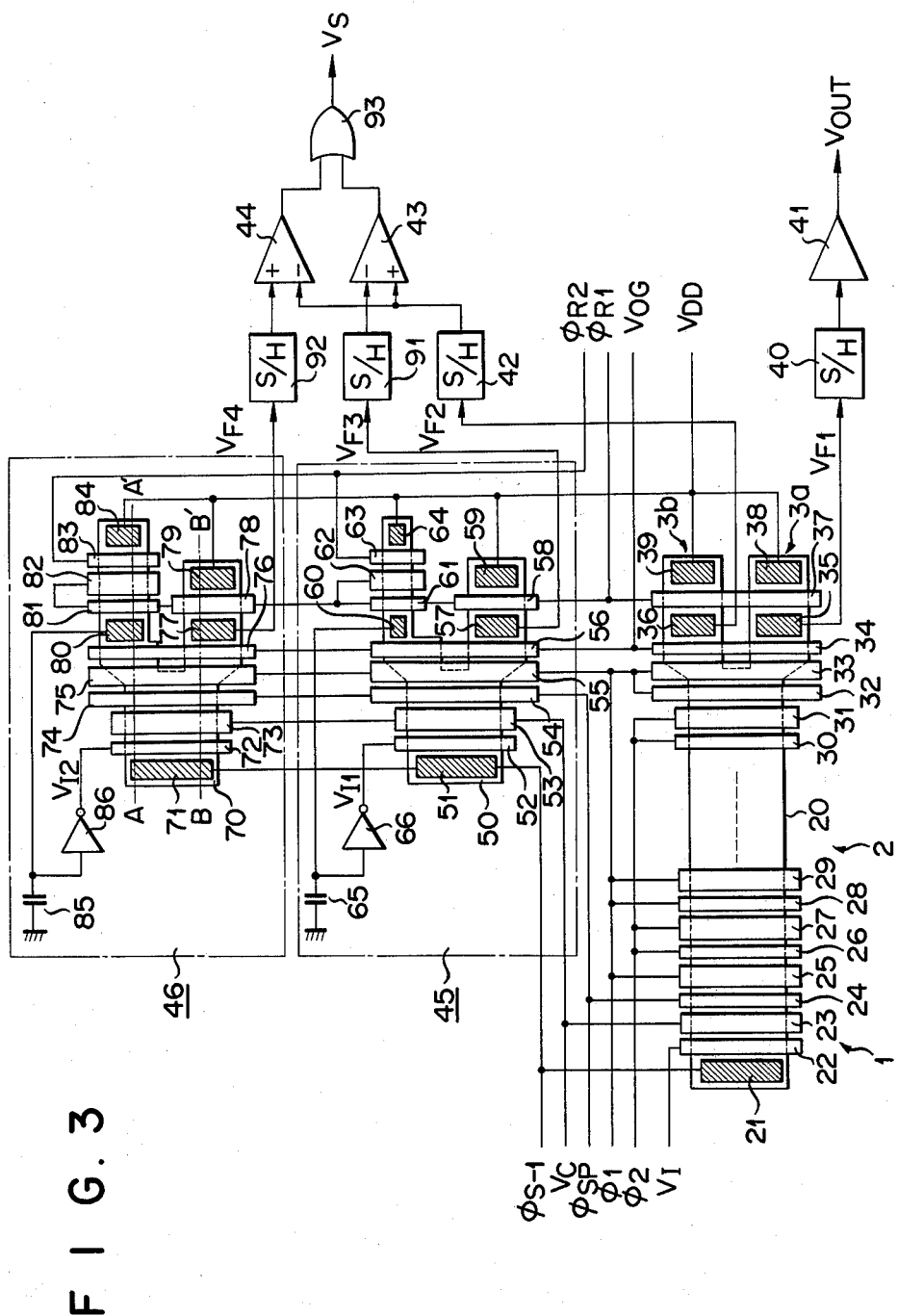
FIG. 3 is a practical arrangement of the charge transfer device according to the invention.

Turning now to FIG. 3, there is shown a practical arrangement of the charge transfer device shown in FIG. 1. In this arrangement, an n-type well 20 for the CCD register is formed on a silicon semiconductor substrate of P type. At one end of the well 20 is formed an n+ type source region 21 supplied with a clock pulse $\phi s-1$ (0 V to +10 V). A charge injected into the well 20 in synchronism with the clock pulse $\phi s-1$ is transferred through an input gate 22 to a storage gate 23 supplied with a DC voltage Vc (+9 V), and the transferred charge is temporarily stored under the storage gate 23. Since the input signal $V_I$ is applied to the input gate 22, a signal charge proportional to the input signal $V_I$ is temporarily stored under the storage gate 23. When a sampling gate 24 is opened by a sampling pulse $\phi sp$ (0 to +4.5 V), the signal charge temporarily stored under the gate 23 is transferred under a transfer electrode 25 to which a transfer pulse $\phi 1$ (0 to +9 V) is applied. The source region 21, the input gate 22, the storage gate 23 and the sampling gate 24 cooperate to form the charge injector 1 shown in FIG. 1. Adjacent the transfer electrode 25 are successively formed a pair of transfer electrodes 26 and 27 to which a transfer pulse $\phi 2$ is applied, and a pair of transfer electrodes 28 and 29 to which a transfer pulse $\phi 1$ is applied. The signal charge packets injected into the CCD register by the charge injector are sequentially transferred under the transfer gates 25 to 33 under control of the two-phase transfer pulses $\phi 1$ and $\phi 2$.

The well 20 for charge transfer is bifurcated at the output side by using a p+ type channel stopper. The signal charge packets transferred under the transfer electrodes 25 to 33 are branched along the bifurcated channels of the well 20. The branched signal charge packets are applied to output detectors 3a and 3b beyond an n−− type barrier formed under an output gate electrode 34 supplied with a DC voltage $V_{OG}$ (+6 V). The output voltage detector 3a is comprised of floating diffusion region 35 of n+ type formed in the well 20, a drain region 38 of n+ type, and a reset gate electrode 37 which is fabricated between the regions 35 and 38, and supplied with a reset pulse $\phi_{R1}$ (0 to +16 V). The output voltage detector 3b is provided with a floating diffusion region 36 and a drain region 39 which are formed in the well 20 on both sides of the reset gate electrode 37. The drain regions 38 and 39 of the output voltage detectors 3a and 3b are impressed with a DC voltage $V_{DD}$ (+16 V). The floating diffusion regions 35 and 36 are reset to the $V_{DD}$ level at the period of the reset pulse $\phi_{R1}$. The electrodes of the charge injector 1, the CCD register 2, and the output voltage detectors 3a and 3b are each formed by a poly-silicon layer. Barriers of n−− type are formed in the well 20 under the narrow electrodes 22, 24, 26, 28, 30, 32 and 34 by ion implantation technique, in order to transfer charge in one direction.

The floating diffusion region 35 in the output voltage detector 3a is coupled with an amplifier 41 through an output amplifier 40 with sample and hold. The floating diffusion region 36 of the output voltage detector 3b is coupled to the non-inverting input of the comparator 43 and the inverting input of the comparator 44, through an output amplifier 42 with sample and hold.

In FIG. 3, reference numerals 45 and 46 respectively represent reference voltage generators corresponding to generators 7 and 8 in FIG. 1. In the reference voltage generator 45, a source region 51 to which the pulse $\phi s - 1$ is applied is formed in an n− type well 50 formed on the p type silicon substrate. Adjacent the source region 51 are successively formed an input gate electrode 52 to which a feedback signal $V_{f1}$ to be described later is applied, a storage gate electrode 53 to which the DC voltage Vc is applied, a sampling gate electrode 54 supplied with the sampling pulse $\phi sp$, a transfer electrode 55 supplied with the transfer pulse $\phi 1$, and an output gate 56 supplied with the DC voltage $V_{OG}$. The well 50 is bifurcated at the output portion, as in the case of the well 20 of the CCD register. In the lower output portion of the well 50 as viewed in the drawing are formed an n+ type floating region 57 and a drain region 59, which are disposed on both sides of a reset gate electrode 58 to which the reset pulse $\phi_{R1}$ is applied. In the upper output portion of the well 50 are formed a pair of reset gate electrodes 61 and 62 to which the reset pulse $\phi_{R1}$ is applied and an n+ type floating diffusion region 60 and a drain region 63 which are disposed on both sides of a reset gate electrode 63 to which another reset pulse $\phi_{R2}$ (0 to +16 V) is applied. The drain regions 59 and 64 are supplied with the DC voltage $V_{DD}$. The floating diffusion region 57 is coupled with the inverting input of the comparator 43 by way of an output amplifier 91 with sample and hold. The floating diffusion region 60 is coupled with the input gate electrode 52 through a negative feedback loop comprising a capacitor 65 formed by an oxide film, and an inverting amplifier 66 having a gain of unity. To the input gate 52, a feedback signal $V_{f1}$ is applied from the inverter 66.

The reference voltage generator 46 is fabricated like the reference voltage generator 45 and thus no detailed description thereof is given here. In the reference voltage generator 46, a floating diffusion region 77 is coupled with the non-inverting input of the comparator 44 through an output amplifier 92 with sample and hold. An input gate 72 is supplied with a feedback signal $V_{f2}$ from an inverting amplifier 86. In those voltage generators 45 and 46, n−− barriers are formed under narrow electrodes 52, 72, 54, 74, 556, 76, 61, 81, 63 and 83. The floating diffusion regions 36, 57 and 77 are formed in an equal size.

The operation of the reference voltage generators 45 and 46 will be described by using the reference voltage generator 45 as an example. Charge with an amount proportional to the voltage of a feedback signal $V_{f1}$ applied to the input gate 52 is injected from the source region 51 under the storage gate electrode 53 and is stored temporarily thereunder. The signal charge stored under the storage electrode 53 is transferred under the transfer electrode 55 when the sampling gate 54 is opened. Under the transfer electrode 55, the signal charge is branched to be supplied to the floating diffusion regions 57 and 60 through the barriers under the output gate 56. Of the charge supplied to the floating diffusion region 60, the charge of a fixed amount, which depends on the product of a difference between surface potentials of the semiconductor substrate under the reset electrodes 61 and 62, and an area of the potential well under the reset electrode 62, is discharged outside by means of the reset gate 63 and the drain region 64. The feedback loop is stabilized in a condition that an amount of charge injected into the floating diffusion region 60 is equal to that discharged from the region 60. Under this stable condition, the charge transferred to the floating diffusion region 57 sets the voltage of the floating diffusion region 57 to $V_{F3}$.

The reference voltage generator 46 is so arranged that the amount of charge discharged from the floating diffusion region 80 is larger than that in the reference signal generator 45. Under the stable condition, the amount of charge transferred to the floating diffusion regions 80 and 77 accordingly increases, too. Therefore, the voltage of the floating diffusion region 77 under the stable condition is $V_{F4}$ lower than $V_{F3}$.

The floating diffusion regions 35 and 36 in the output detectors 3a and 3b in FIG. 3 need not necessarily be formed to have the same size as shown in the figure. When those regions are equal to each other, $V_{F1} = V_{F2}$.

FIGS. 4 and 5 show schematic cross sections of the reference voltage generator 46 taken along lines A-A' and B and B' in FIG. 3. In those figures, like reference numerals are used to designate like portions in FIG. 3. In the figures, reference numeral 100 designates a p type silicon substrate; 101 a channel stopper of p type; 102 to 106 n−− type barriers; 107 an oxide layer. The illustrated electrodes are formed by poly-silicon layers. In FIG. 5, there is additionally illustrated a circuit diagram of the output amplifier 92 with sample and hold connected to the floating diffusion region 76. The amplifier 92, integrated on the semiconductor substrate 100, is comprised of a source follower 110 including n-channel MOS transistors 111 and 112, a sample and hold circuit 113 having an n-channel MOS transistor 114 to which a sampling pulse $\phi_{SH}$ (0 to +16 V) is applied and a capacitor 115, and a source follower 116 having n-channel MOS transistors 117 and 118. The gate voltage $V_B$ of each of MOS transistors 112 and 118 is +2.5 V. The remaining output amplifiers 40, 42, and 91 are formed like the output amplifier 92 as just mentioned.

Turning now to FIG. 6, there is shown a ghost killer disclosed in the aforesaid U.S. Pat. No. 4,127,874 which is an application of the charger transfer device having a means for detecting an operating condition of the CCD register according to the invention. In the ghost killer of feedback type shown in FIG. 6, a video signal which may contain a ghost signal is applied through a substractor 121 to a video amplifier 120. The output signal from the video amplifier 120 is applied to a cathode ray tube and additionally to a ghost detector 122 and a transversal filter 123. The ghost detector 122 detects the ghost signal in the video signal to form a plurality of weighting voltages $V_1$ to $V_n$. The transversal filter 123 forms, as described in detail in the aforesaid U.S. patent, a pseudo ghost signal substantially corresponding to the ghost signal contained in the video signal by using the video signal and the weighting voltages. The pseudo ghost signal is subtractively combined with the video signal in the subtractor 121 to remove the ghost signal from the video signal. The transversal filter 123 is so designed as to include the said means for detecting a charge transfer state in the transversal filter as mentioned above. The output signal Vs from the OR gate 93 shown in FIG. 3 is used to control an electronic switch 124 provided between the output of the transversal filter 123 and the subtractor 121. Specifically, when a charge transfer state in the transversal filter 123 falls outside the dynamic range, the control signal Vs goes high to open the electronic switch 124. As a result, the output signal from the transversal filter 123 is not supplied to the subtractor 121 and the video signal with the ghost signal is directly coupled with the cathode ray tube.

The charge transfer device according to the invention is not limited to the embodiments as illustrated and mentioned above. The CCD register of the two-phase drive type, which has been used in the above-mentioned embodiment, may be replaced by the CCD register of the single phase, the three-phase or four-phase drive type. Further, a BBD register may be used in stead of the CCD register.

What we claim is:

1. A charge transfer device comprising:
   a charge transfer channel with first and second branched output ports;
   first and second output detecting means which are coupled with said first and second output ports and detect output signal charge packets in said charge transfer channel to produce output voltages corresponding to the detected output signal charge packets;
   first and second reference voltage generating means for producing first and second reference voltages; and
   comparing means coupled with said second output detecting means and said first and second reference voltage generating means for comparing the output voltage of said second output detecting means corresponding to the detected output signal charge packet with said first and second reference voltages thereby to detect if a signal charge transferred through said charge transfer channel falls within a given range or not.

2. A charge transfer device according to claim 1 further comprising electronic switch means responsive to said comparing means for interrupting the supply of an output signal from said first output detecting means to a utilization circuit when an amount of the signal charge falls outside the given range.

3. A charge transfer device according to claim 1, in which each of said first and second reference voltage generators comprises a second charge transfer channel with third and fourth branched output ports; charge injecting means responsive to a voltage applied thereto to inject signal charge corresponding to the voltage applied into said second charge transfer channel; means for discharging a given amount of the signal charge transferred to said third output port of said second charge transfer channel; means for feeding back a voltage corresponding to an amount of the signal charge transferred to said third output port to said charge injecting means; and output detecting means coupled to said fourth output port and having an output coupled to said comparing means.

* * * * *